(12) United States Patent
Wu

(10) Patent No.: US 7,738,300 B2
(45) Date of Patent: *Jun. 15, 2010

(54) MEMORY CELL AND METHOD OF PROGRAMMING THE SAME

(75) Inventor: Chao-I Wu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 2 days.

This patent is subject to a terminal disclaimer.

(21) Appl. No.: 12/193,215

(22) Filed: Aug. 18, 2008

(65) Prior Publication Data

US 2008/0304320 A1 Dec. 11, 2008

Related U.S. Application Data

(63) Continuation of application No. 11/668,087, filed on Jan. 29, 2007, now Pat. No. 7,433,238.

(51) Int. Cl.
*G11C 11/34* (2006.01)

(52) U.S. Cl. .............................. 365/185.18; 365/185.03
(58) Field of Classification Search ............ 365/185.18, 365/185.03, 185.14, 185.19, 185.28
See application file for complete search history.

(56) References Cited

U.S. PATENT DOCUMENTS 6,215,702 B1 * 4/2001 Derhacobian et al. .. 365/185.29
6,608,778 B1 * 8/2003 Liu et al. ................ 365/185.28

* cited by examiner

*Primary Examiner*—Anh Phung
(74) *Attorney, Agent, or Firm*—J.C. Patents

(57) ABSTRACT

A method of programming a memory cell is described. The memory cell includes a gate with a charge trapping layer isolated from a substrate for storing data with a first region and a second region separated from the first region. The method of programming the memory cell includes applying a first voltage arrangement with a first gate voltage for programming the first region and applying a second voltage arrangement with a second gate voltage for programming the second region. The first gate voltage is greater than the second gate voltage.

20 Claims, 5 Drawing Sheets

MEMORY CELL AND METHOD OF PROGRAMMING THE SAME

CROSS-REFERENCE TO RELATED APPLICATION

This is a continuation application of patent application Ser. No. 11/668,087, filed on Jan. 29, 2007, now U.S. Pat. No. 7,433,238, issued on Oct. 7, 2008. The entirety of the above-mentioned patent application is hereby incorporated by reference herein and made a part of this specification.

BACKGROUND OF THE INVENTION

1. Field of the Invention

The present invention relates to a method of programming a memory cell, and more particularly, to a method of programming a memory cell capable of adjusting voltages automatically.

2. Description of Related Art

Among various types of memory products, the non-volatile memory allows multiple data writing, reading, and erasing operations. One non-volatile memory is a memory that has widely used in personal computers and electronic equipments. In one non-volatile memory, data can be stored, read out or erased numerous times and any stored data can be retained even after power is cut off.

The typical non-volatile memory cell has a floating gate and a control gate made by doped polysilicon. The floating gate disposed between the control gate and the substrate is in a floating state and is not electrically connected to any devices for storing charges. The control gate is used to control the data writing/reading function. Therefore, one non-volatile memory cell can store either "1" or "0" and is a single-bit (1 bit/cell memory cell) memory cell.

With the increase in the integrity of integrated circuit devices, a non-volatile memory cell adopting nitride silicon to fabricate a charge trapping layer as a replacement of a polysilicon floating gate is provided. Please refer to FIGS. 1A and 1B which are schematic views illustrating a programming operation on a conventional 2 bits/cell non-volatile memory cell. First, a memory cell is provided. The memory cell includes a substrate 102, a source 104, a drain 106, an oxide layer 108, a nitride layer 110, another oxide layer 112, and a polysilicon layer 114. The method of a programming operation of the memory cell is that 10 volts of voltage is applied to the polysilicon layer 114, 0 volt is applied to the source 104, 5~7 volts is applied to the drain 106, and 0 volt is applied to the substrate 102, such that hot electrons generated in a channel region are injected into the nitride layer 110 adjacent to a side of the drain 106 so as to store a bit 116. Thereafter, the voltages of the drain 106 and the source 104 are reversely connected, such that the hot electrons generated in the channel region are injected into the nitride layer 110 adjacent to a side of the source 104 for storing a bit 118. The memory cell is a non-volatile memory cell storing 2 bits in one cell (2 bits/cell).

Nevertheless, during the programming operation performed on a conventional 2 bits/cell non-volatile memory cell, if a bit (a first bit) is stored near the drain of the memory cell, the storage of another bit (a second bit) enhances the programming efficiency and influences the performance of devices. Please refer to FIGS. 2A and 2B which are views illustrating a voltage distribution of the conventional 2 bits/cell non-volatile memory cell. The reference number 210 in FIG. 2A refers to a programming threshold voltage (Vt) distribution curve when a storage operation is performed on the bit 116. The reference number 220 in FIG. 2B refers to the programming Vt distribution curve when the storage operation is performed on the bit 118. It can be learned from FIGS. 2A and 2B that during the programming operation performed on the memory cell, the existing bit 116 (the first bit) affects the programming efficiency of another bit 118 (the second bit), leading to an increase in the Vt and a looser Vt distribution curve (as a width labeled as 230 in FIG. 2B). This is the so-called over-programming.

The cross interference of two bits in one memory cell mentioned above may substantially implicate the device operation and even deteriorate the device reliability. Therefore, how to resolve the above issue has become an important topic in the industry.

SUMMARY OF THE INVENTION

Accordingly, the present invention provides a method of programming a memory cell. Through said method, a tighter Vt distribution curve is obtained, and the issue of the over-programming is further reduced.

The present invention provides a method of programming a memory cell. The memory cell includes a gate with a charge trapping layer isolated from a substrate for storing data with a first region and a second region separated from the first region. The method of programming the memory cell includes applying a first voltage arrangement with a first gate voltage for programming the first region and applying a second voltage arrangement with a second gate voltage for programming the second region. The first gate voltage is greater than the second gate voltage.

According to an embodiment of the present invention illustrating the method of programming the memory cell, a pulse width of the second gate voltage is less than that of the first gate voltage.

According to an embodiment of the present invention illustrating the method of programming the memory cell, the difference between the second gate voltage and the first gate voltage is larger than 0, less than or equal to 0.15 times of the first gate voltage.

According to an embodiment of the present invention illustrating the method of programming the memory cell, the first region is programmed through a channel hot electron injection (CHEI).

According to an embodiment of the present invention illustrating the method of programming the memory cell, the step of applying the first voltage arrangement further includes applying a first substrate voltage to the substrate.

According to an embodiment of the present invention illustrating the method of programming the memory cell, the memory cell further includes a source region and a drain region, and the step of applying the first voltage arrangement further includes applying a first source voltage to the source region and applying a first drain voltage to the drain region. In one embodiment, the first drain voltage is at a constant value. In another embodiment, the first drain voltage is increased using a step-by-step manner.

According to an embodiment of the present invention illustrating the method of programming the memory cell, the step of applying the second voltage arrangement further includes applying a second substrate voltage to the substrate.

According to an embodiment of the present invention illustrating the method of programming the memory cell, the step of programming the first region is performed before the step of programming the second region.

According to an embodiment of the present invention illustrating the method of programming the memory cell, the memory cell includes a multi-level memory cell.

The present invention also provides a method for storing data. The memory cell includes a gate with a charge trapping layer isolated from a substrate for storing data with a first region and a second region separated from the first region. The method of programming the memory cell includes applying a first voltage arrangement with a first gate voltage for programming the first region and applying a second voltage arrangement with a second gate voltage for programming the second region. A second pulse width of the second gate voltage is less than that of the first gate voltage.

According to an embodiment of the present invention illustrating the method for storing data, the step of programming the first region is performed before the step pf programming the second region.

According to an embodiment of the present invention illustrating the method for storing data, a second pulse width of a second source voltage applying to a source of the memory cell during programming the second region is less than that of a first drain voltage applying to a drain of the memory cell during programming the first region.

According to an embodiment of the present invention illustrating the method for storing data, a second source voltage applying to a source of the memory cell during programming the second region is less than that of a first drain voltage applying to a drain of the memory cell during programming the first region.

According to an embodiment of the present invention illustrating the method for storing data, the first region is programmed through a channel hot electron injection (CHEI).

According to an embodiment of the present invention illustrating the method for storing data, the memory cell includes a multi-level memory cell.

The present invention provides a memory cell. The memory cell includes a substrate and a gate on the substrate including a charge trapping layer isolated from the substrate for storing data with a first region and a second region separated from the first region. A first voltage arrangement with a first gate voltage is required for programming the first region and a second voltage arrangement with a second gate voltage is required for programming the second region, and wherein the first gate voltage is greater than the second gate voltage.

According to an embodiment of the present invention illustrating the memory cell, the charge trapping layer includes a material of nitride.

According to an embodiment of the present invention illustrating the memory cell, the memory cell includes a multi-level memory cell.

By way of reducing the gate voltage of a second bit during the programming operation, the programming efficiency of the second bit is then reduced, thus leading to a tighter Vt distribution curve and a reduction of the issue of the over-programming.

In order to the make the aforementioned and other objects, features and advantages of the present invention comprehensible, several embodiments accompanied with figures are described in detail below.

DESCRIPTION OF EMBODIMENTS

Through a method for self-adjusted voltage (SAV), the present invention reduces a gate voltage for programming a second bit. Thereby, a tighter Vt distribution curve can be obtained, and the issue of the over-programming can be further improved. In other words, a gate voltage for programming a second bit is less than a gate voltage for programming a first bit in the present invention so as to improve the above issues.

Several embodiments are described in detail below to better illustrate the method provided by the present invention.

The First Embodiment

Figures 1A, 1B:
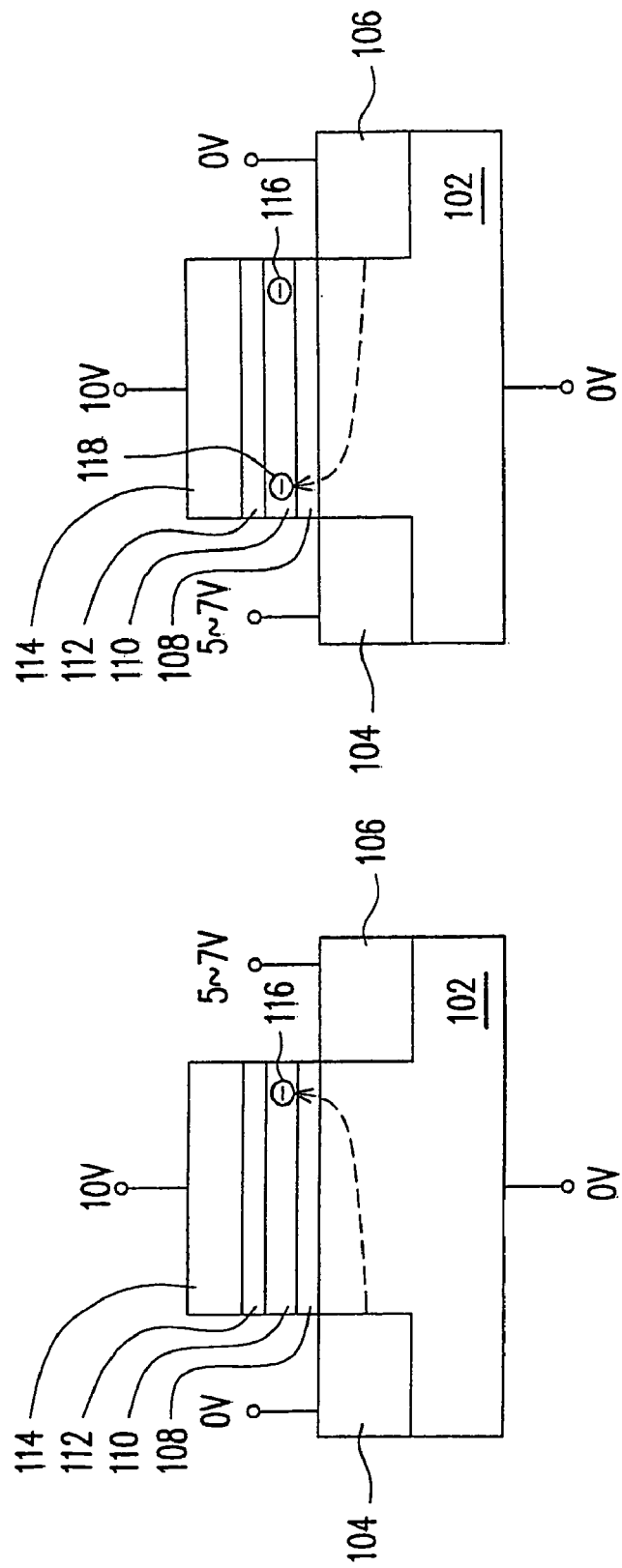
FIGS. 1A and 1B are schematic views illustrating a programming operation performed on a conventional 2 bits/cell non-volatile memory cell.
Figures 2A, 2B:
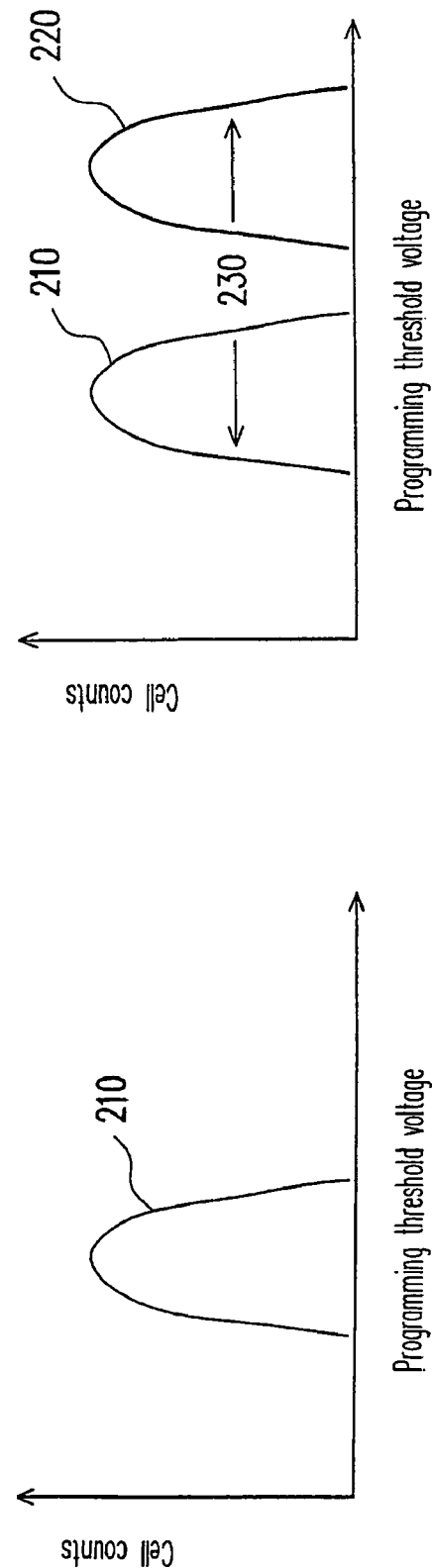
FIGS. 2A and 2B are views illustrating a voltage distribution of the conventional 2 bits/cell non-volatile memory cell.
Figures 3A, 3B:
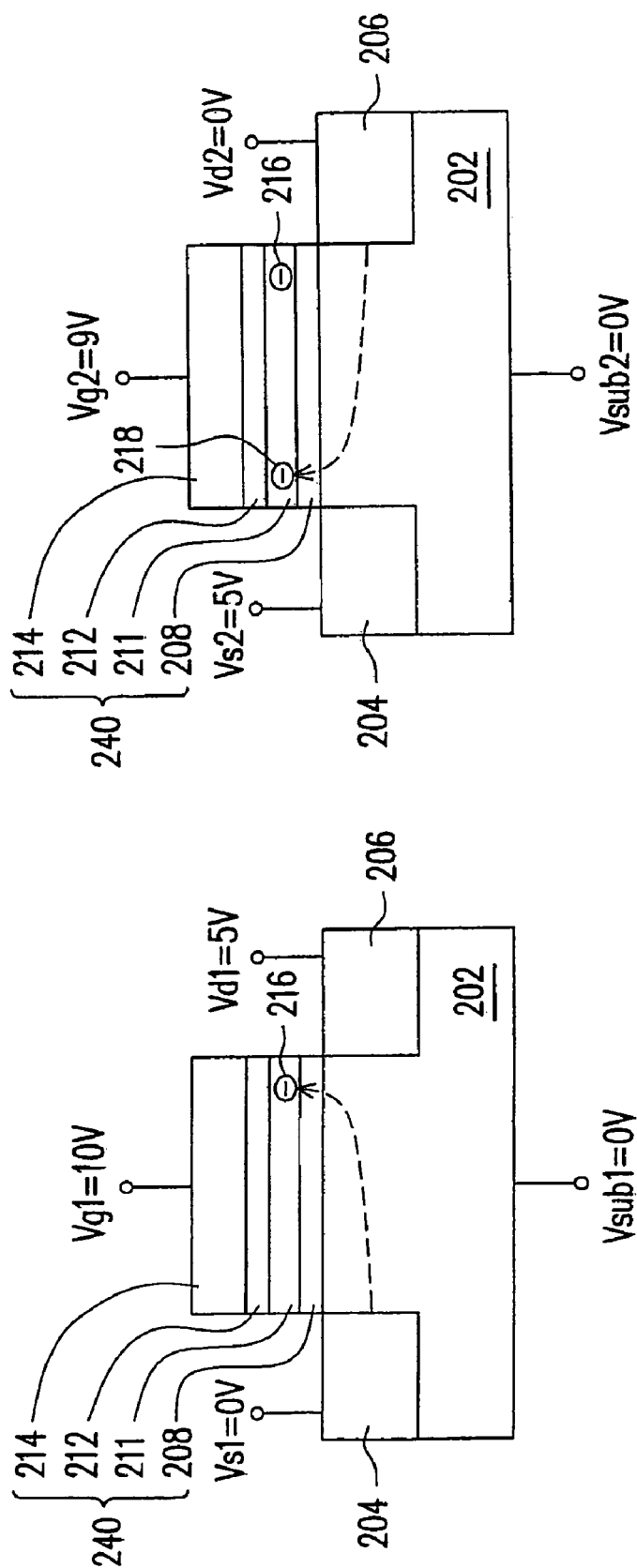
FIGS. 3A and 3B are schematic views illustrating the programming operation performed on a 2 bits/cell non-volatile memory cell according to a first embodiment of the present invention.

FIGS. 3A and 3B are schematic views illustrating a programming operation performed on a 2 bits/cell non-volatile memory cell according to a first embodiment of the present invention.

Referring to FIGS. 3A and 3B, a memory cell is firstly provided. The memory cell includes a substrate 202, a source 204, a drain 206, and a gate 240. The source 204 and the drain 206 are disposed in the substrate 202. The gate 240 is disposed on the substrate 202 between the source 204 and the drain 206. The gate 240 includes, sequentially from the substrate 202, an oxide layer 208, a nitride layer 211, another oxide layer 212, and a polysilicon layer 214.

As shown in FIG. 3A, a first gate voltage Vg1 is applied to the gate 240 when a first programming operation is performed on the memory cell, such that a channel under the gate 240 is opened. The first gate voltage Vg1 is, for example, 10V more or less. A first drain voltage Vd1 is applied to the drain 206, a first source voltage Vs1 is applied to the source 204, and a first substrate voltage Vsub1 is applied to the substrate 202. The first drain voltage Vd1, the first source voltage Vs1, and the first substrate voltage Vsub1 are, for example, 5V, 0V, and 0V, respectively. Based on the above, electrons in the channel region are moved from the source 204 to the drain 206, and the electrons are accelerated by an electric field in the channel to generate hot electrons. Thereby, the electrons enter the nitride layer 210 adjacent to a side of the drain 206 through a channel hot electron injection (CHEI) effect for storing a bit 216 (a first bit).

In addition, as shown in FIG. 3B, a second gate voltage Vg2 is applied to the gate 240 when a second programming operation is performed on the memory cell, such that the channel under the gate 240 is opened. The second gate voltage Vg2 is, for example, 9V more or less. A second drain voltage Vd2 is applied to the drain 206, a second source voltage Vs2 is applied to the source 204, and a second substrate voltage Vsub2 is applied to the substrate 202. The second drain voltage Vd2 is a constant value and is equal to the first drain voltage Vd1. The second drain voltage Vd2, the second source voltage Vs2, and the second substrate voltage Vsub2 are, for example, 5V, 0V, and 0V, respectively. Based on the above, the electrons in the channel region are moved from the drain 206 to the source 204, and the electrons are accelerated by the electric field in the channel to generate the hot electrons. Thereby, the electrons enter the nitride layer 210 adjacent to a side of the source 204 through a CHEI effect for storing a bit 218 (a second bit).

Particularly, the second gate voltage Vg2 is less than the first gate voltage Vg1. Thereby, under the bit 216 (the first bit) is already stored, the programming efficiency is reduced when the storage operation is performed on another bit 218 (the second bit). Accordingly, the issue of the over-programming is improved, and a tighter Vt distribution curve is obtained.

More specifically, the second gate voltage Vg2 is, for example, 0.1 times of the first gate voltage Vg1 in the above embodiment. In the present invention, the difference between the second gate voltage and the first gate voltage is larger than 0, less than or equal to 0.15 times of the first gate voltage.

The Second Embodiment

Figures 4A, 4B:
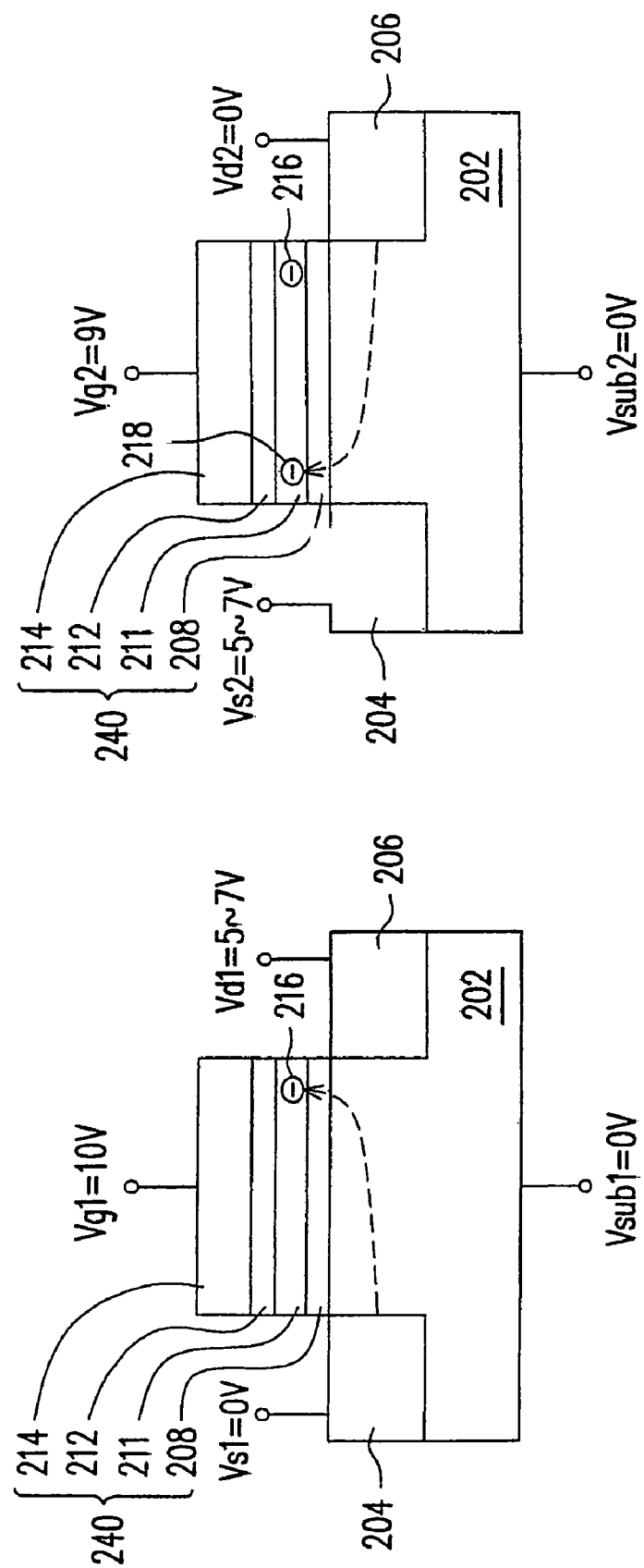
FIGS. 4A and 4B are schematic views illustrating the programming operation performed on the 2 bits/cell non-volatile memory cell according to a second embodiment of the present invention.

Please refer to FIGS. 4A and 4B which are schematic views illustrating a programming operation performed on the 2 bits/cell non-volatile memory cell according to a second embodiment of the present invention. The programming method of the second embodiment is similar to that of the first embodiment. The main difference lies in that the first drain voltage Vd1 is equal to the second source voltage Vs2, and the first drain voltage Vd1 is increased using a step-by-step manner. The first drain voltage Vd1 and the second source voltage Vs2 are predetermined as 5V, for example, and later increased to 7V with time.

Likewise, the method provided by the present embodiment is also likely to improve the issue of the over-programming and to obtain a tighter Vt distribution curve.

According to the second embodiment, the method for performing the programming operation on the 2 bits/cell memory cell is by the manner of enabling the second gate voltage Vg2 to be less than the first gate voltage Vg1 and of equalizing the first drain voltage Vd1 and the second source voltage Vs2. Using the way of enabling the second gate voltage Vg2 to be less than the first gate voltage Vg1, the issue of the over-programming resulting from the cross interference of two bits in one memory cell disclosed in the related art is reduced, and a tighter Vt distribution curve is obtained as well.

The Third Embodiment

The programming method of the third embodiment is similar to that of the first embodiment. The main difference lies not only in that the second gate voltage Vg2 is less than the first gate voltage Vg1, but also in that the second source voltage Vs2 is less than the first drain voltage Vd1. And, the first drain Vd1 and the second source voltage Vs2 are at a constant value.

The Fourth Embodiment

The programming method of the fourth embodiment is similar to that of the third embodiment. The main difference lies not only in that the second gate voltage Vg2 is less than the first gate voltage Vg1, but also in that the second source voltage Vs2 is less than the first drain voltage Vd1. And, the first drain Vd1 and the second source voltage Vs2 are increased using a step-by-step manner.

According to the third and the fourth embodiments, the method for performing the programming operation on the 2 bits/cell memory cell is by the manner of enabling the second gate voltage Vg2 to be less than the first gate voltage Vg1 and the second source voltage Vs2 to be less than the first drain voltage Vd1. Said method can also reduce the programming efficiency of the second bit, improve the issue of the over-programming, and obtain a tighter Vt distribution curve.

According to other embodiments, the programming method of the present invention includes performing the storage operation on the 2 bits/cell memory by the manner of enabling a pulse width of the second gate voltage Vg2 to be less than that of the first gate voltage Vg1. In addition, the programming method of the present invention includes performing the storage operation on the 2 bits/cell memory by the same way of enabling the pulse width of the second gate voltage Vg2 to be less than that of the first gate voltage Vg1 and of enabling the pulse width of the second source voltage Vs2 to be less than that of the first drain voltage Vd1. Likewise, said method can reduce the programming efficiency of the second bit, improve the issue of the over-programming, and obtain a tighter Vt distribution curve.

Figure 5:
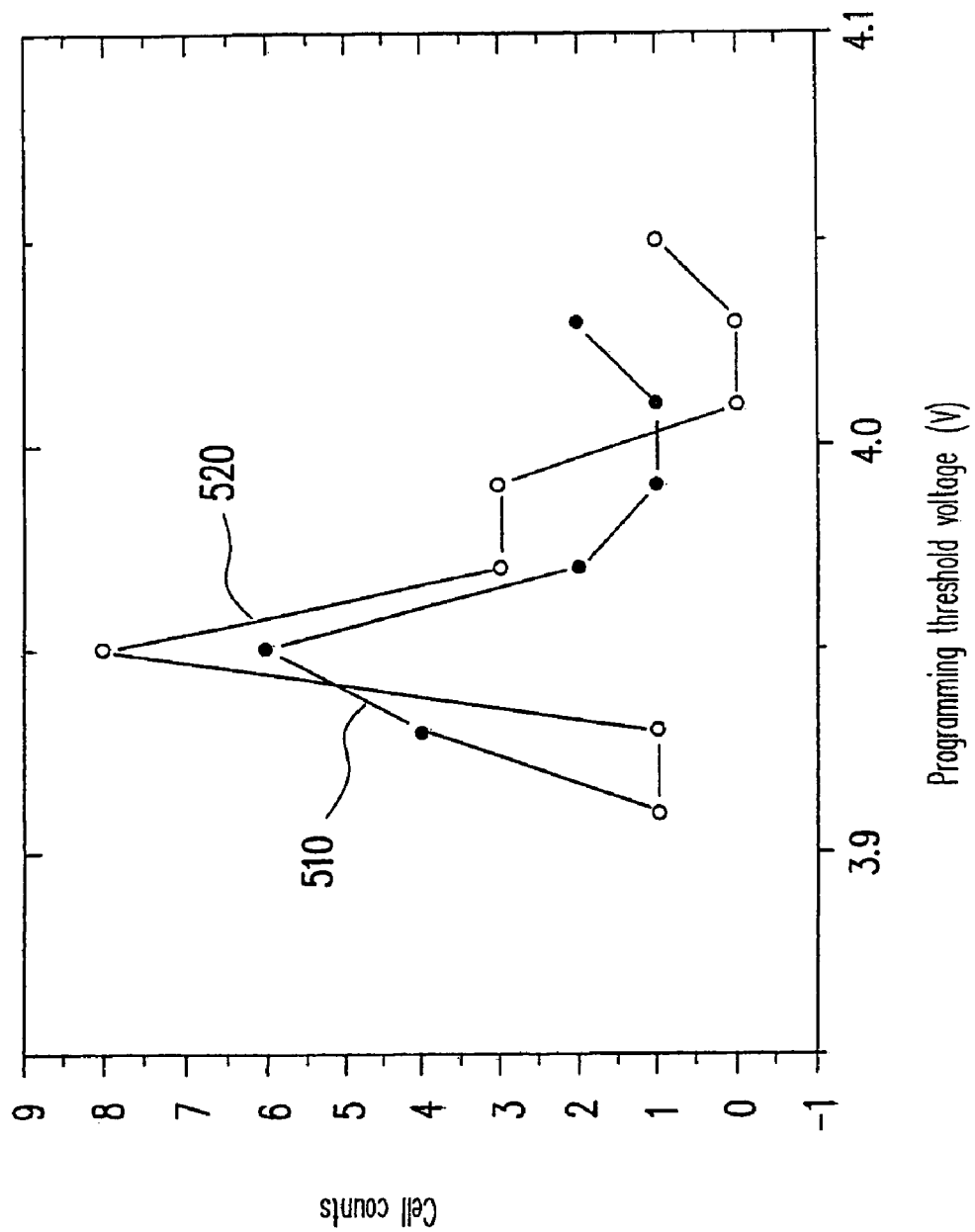
FIG. 5 is a view illustrating the voltage distribution of the 2 bits/cell non-volatile memory cell of the present invention.

Please refer to FIG. 5 which is a view illustrating a voltage distribution of the 2 bits/cell non-volatile memory cell of the present invention. The voltage distribution shown in FIG. 5 is an experimental result obtained by performing the programming operation according to the first embodiment. A curve 510 is the programming Vt distribution curve of the first bit. A curve 520 is the programming Vt distribution curve of the second bit. It can be learned from FIG. 5 that the method of the present invention can reduce the programming efficiency of the second bit, obtain a tighter Vt distribution curve, and further improve the issue of the over-programming.

Certainly, the method of the present invention can be applied not only to the 2 bits/cell non-volatile memory cell, but also to a 4 bits/cell, 8 bits/cell, or other multi-level non-volatile memory cells.

In summary, through a method for self-adjusted voltage (SAV), in other words, by way of reducing the gate voltage of the second bit during the programming operation, the programming efficiency of the second bit is then reduced, thus leading to a tighter Vt distribution curve and a reduction of the issue of the over-programming.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method for storing data comprising:
   providing a memory cell, the memory cell comprising a gate with a charge trapping layer isolated from a substrate for storing data with a first region and a second region separated from the first region,
   programming the memory cell comprising:
   applying a first voltage arrangement with a first gate voltage for programming the first region; and
   applying a second voltage arrangement with a second gate voltage for programming the second region,
   wherein the first gate voltage is greater than the second gate voltage.

2. The method of claim 1, wherein a pulse width of the second gate voltage is less than that of the first gate voltage.

3. The method of claim 1, wherein the difference between the second gate voltage and the first gate voltage is larger than 0, less than or equal to 0.15 times of the first gate voltage.

4. The method of claim 1, wherein the first region is programmed through a channel hot electron injection (CHEI).

5. The method of claim 1, wherein the step of applying the first voltage arrangement comprises applying a first substrate voltage to the substrate.

6. The method of claim 1, wherein the memory cell further comprises a source region and a drain region, and the step of applying the first voltage arrangement further comprises applying a first source voltage to the source region and applying a first drain voltage to the drain region.

7. The method of claim 6, wherein the first drain voltage is at a constant value.

8. The method of claim 6, wherein the first drain voltage is increased using a step-by-step manner.

9. The method of claim 1, wherein the step of applying the second voltage arrangement further comprises applying a second substrate voltage to the substrate.

10. The method of claim 1, wherein the step of programming the first region is performed before the step of programming the second region.

11. The method of claim 1, wherein the memory cell comprises a multi-level memory cell.

12. A method for storing data comprising:
   providing a memory cell, the memory cell comprising a gate with a charge trapping layer isolated from a substrate for storing data with a first region and a second region separated from the first region,
   programming the memory cell comprising:
   applying a first voltage arrangement with a first gate voltage for programming the first region; and
   applying a second voltage arrangement with a second gate voltage for programming the second region,
   wherein a second pulse width of the second gate voltage is less than that of the first gate voltage.

13. The method of claim 12, wherein the step of programming the first region is performed before the step pf programming the second region.

14. The method of claim 12, wherein a second pulse width of a second source voltage applying to a source of the memory cell during programming the second region is less than that of a first drain voltage applying to a drain of the memory cell during programming the first region.

15. The method of claim 12, wherein a second source voltage applying to a source of the memory cell during programming the second region is less than that of a first drain voltage applying to a drain of the memory cell during programming the first region.

16. The method of claim 12, wherein the first region is programmed through a channel hot electron injection (CHEI).

17. The method of claim 12, wherein the memory cell comprises a multi-level memory cell.

18. A memory cell comprising:
   a substrate; and
   a gate on the substrate comprising a charge trapping layer isolated from the substrate for storing data with a first region and a second region separated from the first region,
   wherein a first voltage arrangement with a first gate voltage is required for programming the first region and a second voltage arrangement with a second gate voltage is required for programming the second region, and wherein the first gate voltage is greater than the second gate voltage.

19. The memory cell of claim 18, wherein the charge trapping layer includes a material of nitride.

20. The memory cell of claim 18, wherein the memory cell comprises a multi-level memory cell.

\* \* \* \* \*